United States Patent
Iacoponi et al.

(10) Patent No.: US 6,468,889 B1
(45) Date of Patent: Oct. 22, 2002

(54) BACKSIDE CONTACT FOR INTEGRATED CIRCUIT AND METHOD OF FORMING SAME

(75) Inventors: John A. Iacoponi, Austin, TX (US); John C. Miethke, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 58 days.

(21) Appl. No.: 09/633,931

(22) Filed: Aug. 8, 2000

(51) Int. Cl.$^7$ ............................................. H01L 21/44
(52) U.S. Cl. ........................ 438/597; 438/622; 438/667; 438/675
(58) Field of Search ................................ 438/14–18, 233, 438/256, 399, 533, 586, 597, 622, 637, 639–641, 667, 674, 675, 672, 673, 629, 700, 977

(56) References Cited

U.S. PATENT DOCUMENTS

| | | | |
|---|---|---|---|
| 5,108,553 A | * 4/1992 | Foster et al. | 205/125 |
| 5,511,428 A | * 4/1996 | Goldberg et al. | 73/777 |
| 5,990,562 A | * 11/1999 | Vallett | 257/774 |
| 6,075,712 A | 6/2000 | McMahon | 361/783 |
| 6,107,109 A | * 8/2000 | Akram et al. | 438/15 |
| 6,197,664 B1 | * 3/2001 | Lee et al. | 438/466 |
| 6,273,557 B1 | * 8/2001 | Milligan et al. | 347/65 |
| 6,352,923 B1 | * 3/2002 | Hsuan et al. | 438/613 |
| 6,252,300 B1 | 6/2002 | Hsuan et al. | 257/686 |

FOREIGN PATENT DOCUMENTS

EP  0 926 723 A1  11/1997  ........... H01L/21/74

OTHER PUBLICATIONS

International Search Report dated May 10, 2002 for International application No. PCT/US01/23571 Filed Jul. 26, 2001.

* cited by examiner

*Primary Examiner*—Matthew Smith
*Assistant Examiner*—Craig P. Lytle
(74) *Attorney, Agent, or Firm*—Williams, Morgan & Amerson

(57) ABSTRACT

A contact formed from the backside of an integrated circuit device includes a first conductive layer on a first surface of the integrated circuit device and a second conductive layer on a second surface of the device. The two conductive layers are coupled by way of an opening through the semiconductor substrate separating the two conductive layers. A method for making the backside contact comprises forming the first conductive layer, forming an opening through the semiconductor substrate to expose at least a portion of the underside of the first conductive layer, then filling the opening with a conductive material to provide an electrical contact to the first conductive layer from the backside of the integrated circuit device.

8 Claims, 4 Drawing Sheets

BACKSIDE CONTACT FOR INTEGRATED CIRCUIT AND METHOD OF FORMING SAME

BACKGROUND OF THE INVENTION

1. Field of the Invention

This invention relates generally to semiconductor fabrication technology, and, more particularly, a backside contact for an integrated circuit device and a method for fabricating the backside contact.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate dielectric thickness, and the like, are reduced. For example, all other things being equal, the smaller the channel length of the FET, the faster the transistor will operate. Thus, there is a constant drive to reduce the size, or scale, of the components of a typical transistor to increase the overall speed of the transistor, as well as integrated circuit devices incorporating such transistors. Additionally, reducing the size, or scale, of the components of a typical transistor also increases the density, and number, of the transistors that can be produced on a given amount of wafer real estate, lowering the overall cost per transistor as well as the cost of integrated circuit devices incorporating such transistors.

In the fabrication of integrated circuits, many layers are formed atop one another in "sandwich" fashion. These layers include semiconductor materials, insulating materials, and conductive materials, for example, metals. A common integrated circuit may contain as many as ten to twenty different layers, and as many as six or seven of those layers may be metal layers. Generally, the metal layers are patterned to form electrical interconnects, or conductors, that carry electrical power for distribution throughout the integrated circuit, as well as signals, for example, control signals, address signals and data signals.

FIG. 1 illustrates a cross-section of a simple form of an integrated circuit device. A semiconductor substrate 10, which may be silicon or other suitable material, forms the foundation upon which the integrated circuit will be built. Transistors may be formed atop the substrate 10 and, for example, such a transistor may comprise a gate 11. The gate 11, which is typically separated from the semiconductor substrate by a thin insulating layer (not shown), may comprise a conductive material, such as a doped polycrystalline silicon, or polysilicon. As is well known in the art of semiconductor device fabrication, a polysilicon material may be deposited or otherwise formed over the surface of the substrate 10 (typically separated therefrom by a thin oxide layer) and thereafter patterned to form transistor gates.

Overlaying the substrate 10 and the gate 11 may be a dielectric, or insulating, layer 12, for example, a layer of silicon dioxide. Commonly in the fabrication of semiconductor integrated circuits, above the insulating layer 12 will be formed a layer of electrically conductive material that is patterned and etched to form conductive interconnects 13 and 14. Typically, the conductive interconnects will be formed from a metal. The interconnect 13 may be electrically coupled to the gate 11 by a conductive material 15, for example, a metal. As is well understood in the field of semiconductor integrated circuit fabrication, a via may be formed through the dielectric layer 12, and the via may be filled with a conductive material, for example, a metal, before or during the formation of the conductive layer used to form the interconnects 13 and 14. Thus, electrical interconnections may be made between conductive layers at different levels of the integrated circuit device.

Overlaying the interconnects 13 and 14 will be a second dielectric, or insulating, layer 16. As in the case of layer 12, layer 16 may comprise a silicon dioxide or other suitable material. Also, layers 12 and 16, as well as additional dielectric layers discussed below, may be formed on the integrated circuit by any suitable known technique, for example, CVD, spin-on techniques, etc. Atop the dielectric layer 16, another conductive layer, again, for example, metal, may be formed and patterned to create further interconnects 20 and 21. As illustrated in FIG. 1, interconnects 14 and 20 may be electrically coupled by way of conductive material 19 through a via. Overlaying the interconnects 20 and 21 is yet another dielectric, or insulating, layer 22, which may also comprise a suitable insulating material, for example, silicon dioxide.

Additional conductive layers and dielectric layers may be formed atop the insulating layer 22 to form, for example, interconnects 23, 24, 26 and 29, and dielectric layers 25 and 28. When fabrication of the integrated circuit is essentially complete, contact pads, for example pad 31, will be formed atop the integrated circuit. These contact pads will be coupled to various points in the integrated circuit, for example, interconnect 13 by way of path 32 and lead 33. Path 32 may be formed by etching through at least some of the layers overlaying the substrate 10. For example, as illustrated in FIG. 1, path 32 is etched through each of the dielectric layers 16, 22, 25 and 28 to facilitate an electrical connection between lead 33 and contact 31 and the interconnect 13. Likewise, throughout the integrated circuit device, similar paths 32 may be etched through various of the layers of the integrated circuit device to contact selected electrical interconnects at the various metal, or conductive, layers. The contact pad 31, lead 33 and path 32 may facilitate the supply of electrical power to the integrated circuit, or they may provide a route for signals into and out of the integrated circuit. For example, DC voltages may be applied to various portions of the integrated circuit by means of contact pads 31, leads 33 and paths 32. Also, data input and output signals, address signals and a variety of control signals may be applied to or retrieved from the integrated circuit by means of contact pads 31, leads 33 and paths 32.

As illustrated in FIG. 1, electrical paths 32 between the contact pads 31 and the various metal layers are routed from the top surface 34 of the integrated circuit device, down through the various dielectric layers, to the particular conductive layer or interconnect to be contacted. As integrated circuits become more complex, they become more dense. Consequently, the space between devices, including interconnects, on the integrated circuit becomes smaller. Moreover, as more and more conductive layers are used in the fabrication process, the routing of the contact paths 32 to the selected layer or interconnect becomes more complex and constricted. In addition, although efforts have been made to reduce power consumption, many modern devices require more electrical current than did their predecessors, and these larger electric currents are typically transported by way of the electrical paths 32.

To exacerbate the situation, electrical power typically must be routed to the lowest metal layers in the integrated circuit. In those situations, routing of the contact paths 32 presents numerous problems. For example, because of the small space between adjacent devices and interconnects in the integrated circuit, the cross-section of the electrical path 32 must be small. As the integrated circuits become more complex and utilize more layers, the length of the electrical path 32 becomes longer. As the cross-section of the electrical path 32 decreases and its length increases, it presents a greater resistance to the flow of current, resulting in, among other things, more heat generated.

The present invention is directed to overcoming, or at least reducing the effects of, one or more of the problems set forth above.

SUMMARY OF THE INVENTION

In one aspect of the present invention, a semiconductor device comprises a semiconductor substrate having first and second surfaces, an insulating layer formed over the first surface of the substrate, a first conductive layer formed over the insulating layer, a second conductive layer formed over the second surface of the substrate, and a connector coupling the first and second conductive layers by way of an opening through the semiconductor substrate.

In another aspect of the present invention, a method is provided for forming a backside contact on an integrated circuit device, the method comprising forming a dielectric layer over a first surface of a semiconductor substrate, forming a conductive interconnect over the dielectric layer, forming an opening in the substrate and in the dielectric layer to exposed at least a portion of the conductive interconnect, and filling the opening with a conductive material to provide electrical contact with the conductive interconnect.

BRIEF DESCRIPTION OF THE DRAWINGS

The invention may be understood by reference to the following description taken in conjunction with the accompanying drawings, in which.

Figure 1:
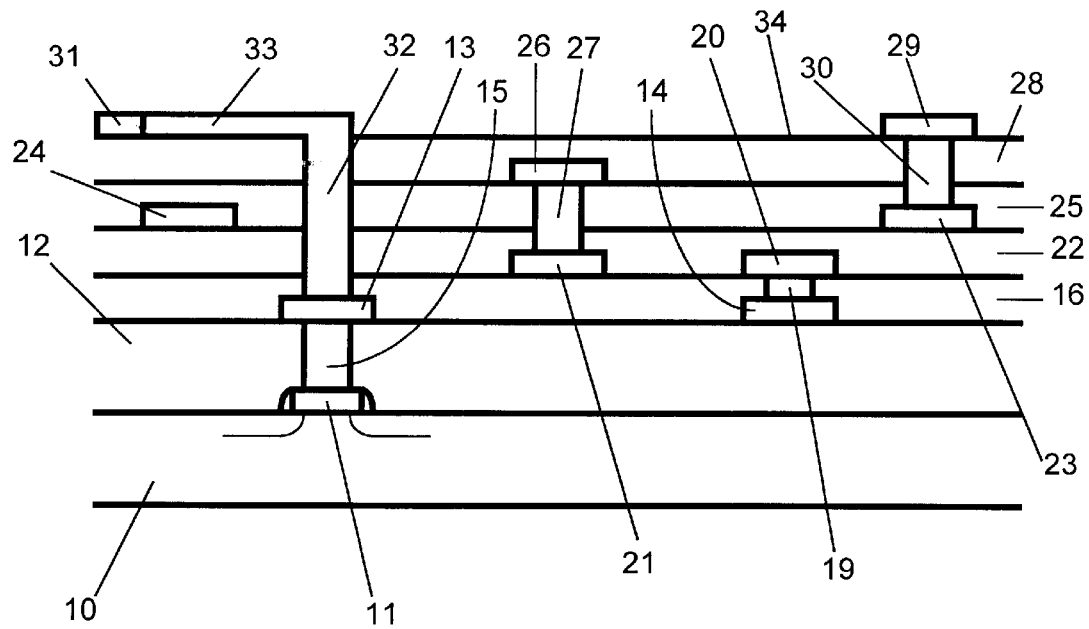
FIG. 1 is a simplified illustration of a cross-section of a conventional integrated circuit.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Illustrative embodiments of a backside contact and methods for fabrication of such a contact according to the present invention are shown in FIGS. 2–8. Although the various regions and structures of a semiconductor integrated circuit are depicted in the drawings as having very precise, sharp configurations and profiles, those skilled in the art recognize that, in reality, these regions and structures are not as precise as indicated in the drawings. Nevertheless, the attached drawings are included to provide illustrative examples of the present invention.

In general, the present invention is directed to the manufacture of a semiconductor integrated circuit device. As will be readily apparent to those skilled in the art upon a complete reading of the present application, the present method is applicable to a variety of technologies, for example, NMOS, PMOS, CMOS, and the like, and is readily applicable to a variety of devices, including, but not limited to, logic devices, memory devices, and the like.

Figure 2:
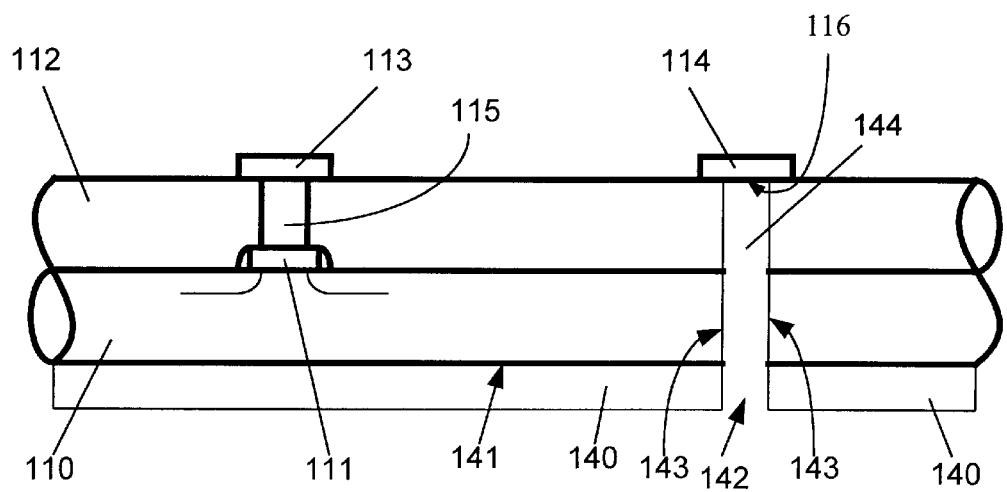
FIGS. 2–8 illustrate schematically in cross-section various embodiments of a back-side contact and methods for forming the backside contact according to the present invention.

FIG. 2 illustrates a cross-section of a portion of an integrated circuit device. A substrate 110 has formed atop it a gate 111 of a conductive material, for example, doped polysilicon. Typically, the gate 111 is separated from the substrate 110 by a thin insulating layer (not shown), e.g., a gate device. Formed over the gate 111 is a dielectric layer 112, for example, silicon dioxide. The dielectric layer 112 may be formed using a variety of known materials and techniques, such as CVD, spin-on techniques, etc. Atop the layer 112, another conductive layer, for example metal, may be deposited or otherwise formed. Using well known patterning and etching techniques, conductive traces, or interconnects, 113 and 114 may be formed. These interconnects 113 and 114 may function as electrically conductive pathways, or interconnections, between various portions of the integrated circuit device. To facilitate interconnection between adjacent conductive layers or interconnects, a via may be etched through the dielectric layer 112 and filled with a conductive material 115 to complete electrical connection between a gate 111 and an interconnect 113. The formation of multiple dielectric and conductive layers over the substrate 110, as well as the use of vias to facilitate interconnection between various conductive layers, is well known and understood by those of ordinary skill in the art of semiconductor fabrication.

After formation of the conductive layer used to form interconnects 113 and 114, and before completion of the integrated circuit fabrication process, a backside contact 146 (see FIG. 3) may be formed according to the present invention. The backside contact 146 may be formed either before or after the interconnects 113 and 114 have been patterned and formed from their conductive layer. As illustrated in FIG. 2, a photoresist or other suitable material may be used to form a mask 140 on a backside surface 141 of the substrate 110. The term "backside" as used in this specification refers to that surface of the substrate 110 opposite the surface of the substrate 110 on which the typical dielectric and conductive layers are formed. The photoresist or other masking material may be patterned utilizing well known techniques to form an opening 142 in the mask 140. Any of a variety of known techniques for accomplishing an anisotropic etch may thereafter be utilized to form an opening 144 through the portion of the substrate 110 and the dielectric layer 112 underlying the opening 142 in the mask 140. For example, to etch though the silicon substrate, a combination of hydrogen bromide (HBr), chlorine (Cl) and oxygen (O2) or a combination of SF6 and argon will be appropriate. For an etch through the dielectric layer 112, for example, a silicon dioxide material, a combination of $CF_4$, $CHF_3$ and argon will provide an appropriate etch environment. Alternatively, a combination of other fluorocarbon-containing gases will work. These etching chemistries, as well as other appropriate chemistries and techniques, are well known to and understood by those of ordinary skill in the art. The opening 144 will have sidewalls 143 that are substantially perpendicular to the surface 141 of the substrate 110. The anisotropic etch will be continued until the opening 144 reaches the conductive interconnect 114.

Figure 3:
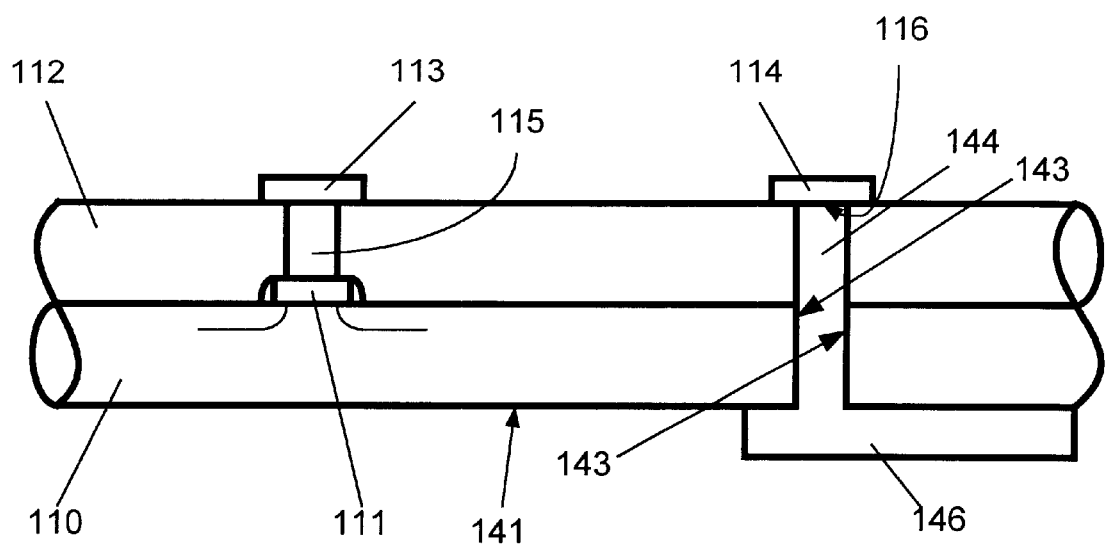

Referring to FIG. 3, following the anisotropic etch to form the opening 144, the mask 140 will be removed from the surface 141 of the substrate 110. An insulating film may be formed along the sidewalls 143 of the opening 144, particularly in the vicinity of the exposed substrate, and over the surface 141 of the substrate 110. To form this insulating film, for example, a selective deposition or growth step may be used in an oxidizing ambient or a thin insulating film may be deposited. These and other appropriate techniques for forming the insulating layer along the sidewalls 143 and over the surface 141 are well known to and understood by those of ordinary skill in the art. Using any of a number of well-known techniques, such as deposition techniques, a conductive material may be formed over the surface 141 of the substrate 110 and in the opening 144, thereby forming a conductive layer on the surface 141 of the substrate 110. Thereafter, utilizing well known deposition and patterning techniques, a backside contact 146 may be formed, facilitating electrical connection of the interconnect 114 to the backside contact 146 by way of the conductive material filling the opening 144 through the substrate 110 and the dielectric layer 112. The conductive material used to fill the opening 144 and form the contact 146 may be any suitable conductive material, for example, tungsten, aluminum or copper. When copper is to be used, the bottom surface of the metal interconnect 114 may be used as a catalytic surface for the electrolyses deposition of the copper. Barrier layers comprised of, for example, titanium, titanium nitride, or other refractory metal or refractory metal nitride may also be formed in the opening 144 prior to forming the conductive material therein. In addition, before the opening 144 is filled with a conductive material, the undersurface 116 of the interconnect 114 should be cleaned. For example, a directional etch, known as a pre-clean etch or RF pre-clean, may be used. A directional sputter etch in an argon plasma ambient would clean the undersurface 116 appropriately. The cross-section of the opening 144 may be of any desirable shape or size.

Figure 4:
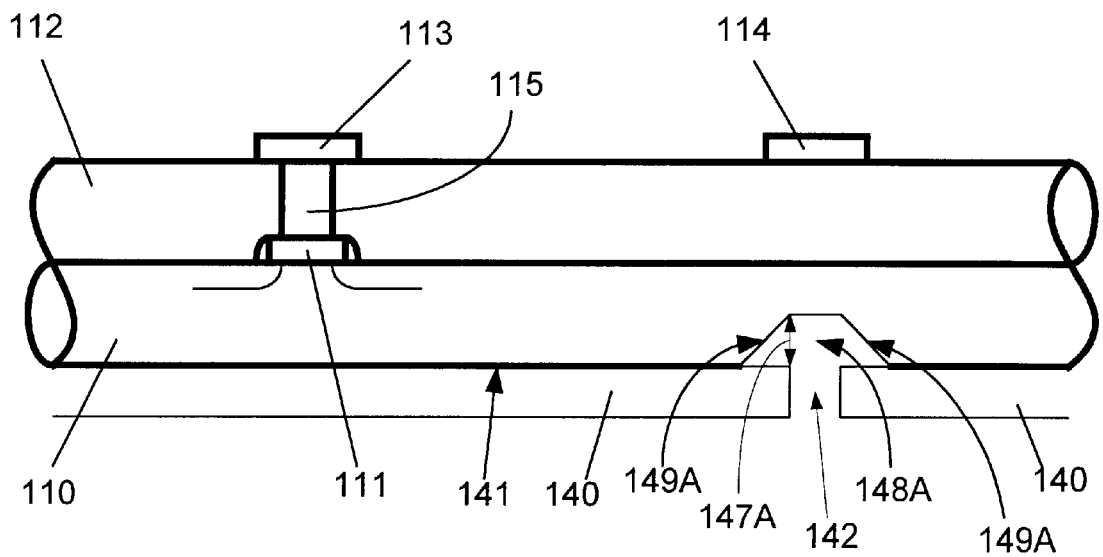

FIG. 4 illustrates an alternative method for forming the backside contact 146. A photoresist or other suitable masking material may be used to form a mask 140 on the backside surface 141 of the substrate 110, and the mask 140 is patterned to form an opening 142 therethrough. An isotropic etch process is performed through the opening 142 to create an opening 148A in the substrate 110. Because this step is isotropic in nature, the etching undercuts the masking layer 140 to form tapered facet edges 149A in the substrate 110. In the specific embodiment illustrated in FIG. 4, the isotropic etch step is performed long enough to form the opening 148A, but it is not performed so long as to etch entirely through the substrate 110. Rather, the depth 147A of the opening 148A in the substrate 110 is less than the thickness of the substrate 110 in the vicinity of the opening 148A.

Figure 5:
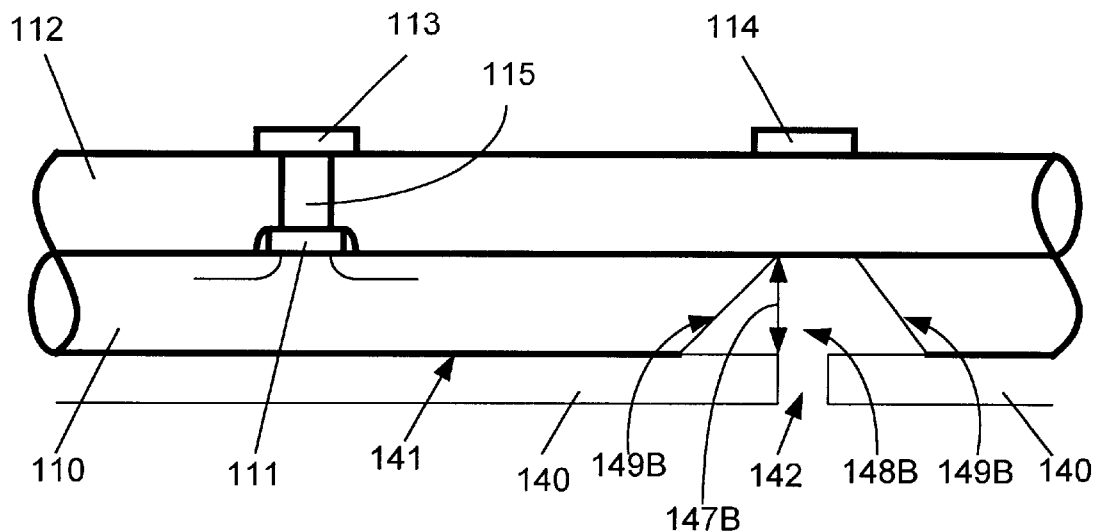

In another embodiment, illustrated in FIG. 5, the isotropic etch may be continued until the opening 148B extends substantially entirely through the substrate 110. In this particular embodiment, the opening 148B and, thus, the tapered facet edges 149B, extend substantially entirely through the substrate 110 but do not substantially encroach upon the insulating layer 112. In other words, in this embodiment, the depth 147B of the opening 148B is approximately equal to the thickness of the substrate 110 in the vicinity of the opening 148B. Also in this specific embodiment, because the depth 147B of the opening 148B is greater than the depth 147A of the opening 148A in FIG. 4, the width of the opening 148B is also greater than the width of the opening 148A in FIG. 4. Thus, the tapered facet edges 149B are formed in the embodiment, as illustrated in FIG. 5. As examples, a dry plasma process using $NF_3$ or $CF_4$ would be appropriate. Alternatively, a wet chemical process using a combination of $HNO_3$ and HF for Si etching or a combination of $NH_4F$, HF and water for $SiO_2$ etching would be appropriate. Those of ordinary skill in the art will know and understand these processes as well as other processes that may be used to advantage.

Figure 6:
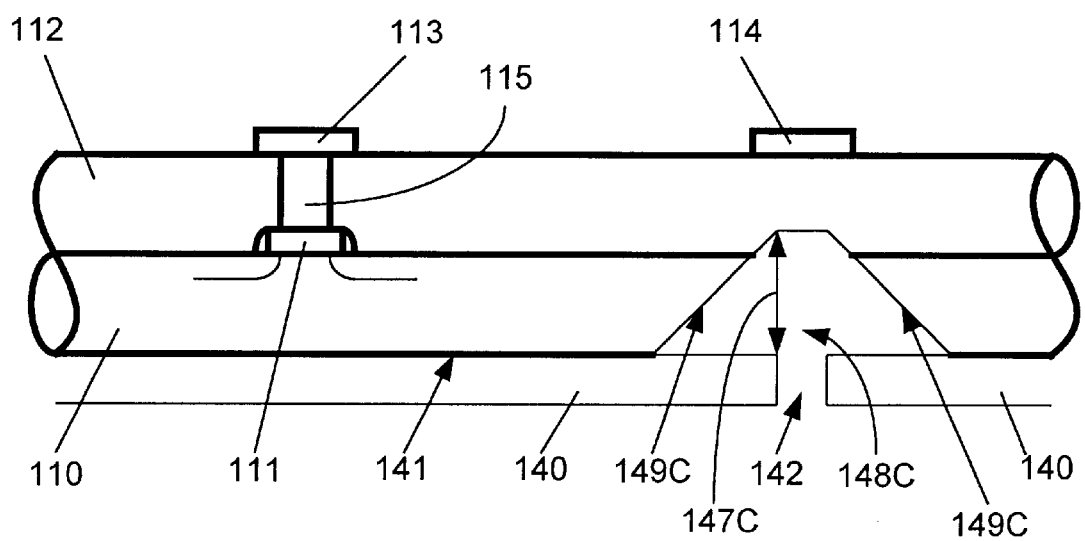

FIG. 6 shows yet another embodiment of the present invention wherein the isotropic etch through the opening 142 of the mask 140 proceeds entirely through the substrate 110 and into the insulating layer 112 to form the opening 148C having facet edges 149C. In this embodiment, the depth 147C of the opening 148C is greater than the thickness of the substrate 110 in the vicinity of the opening 148C. The tapered facet edges 149C extend into the dielectric layer 112. Exemplary etch processes that may be used have been discussed above and are known and understood by those of ordinary skill in the art.

Figure 7:
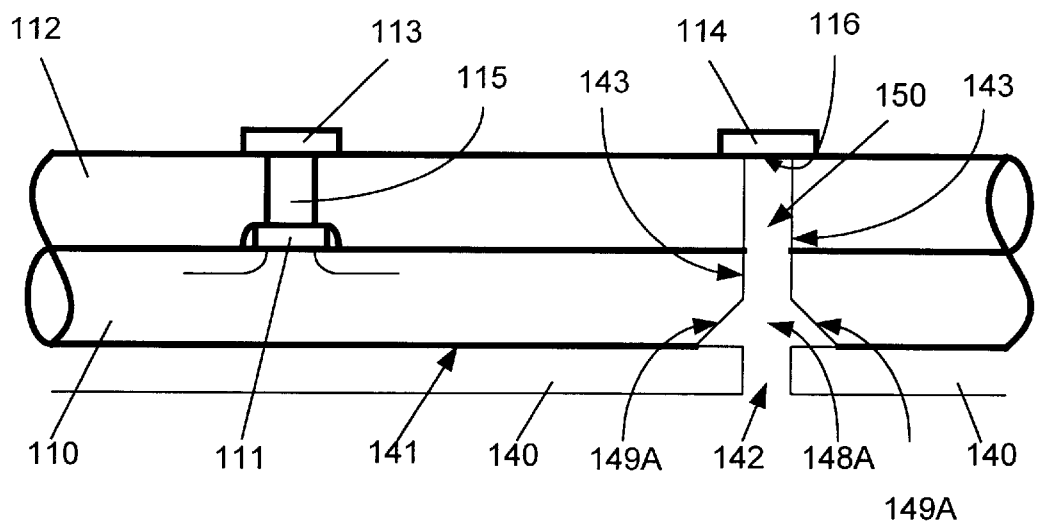

FIG. 7 illustrates further processing following the processing illustrated in FIG. 4. Following the isotropic etch that forms the opening 148A in the substrate 110, an anisotropic etch is performed through the opening 142 in the mask 140 and through the opening 148A to form an opening 150 through the remaining portion of the substrate 110 and entirely through the insulating layer 112 to the interconnect 114. Because this second etch step is anisotropic, the opening 150 includes sidewalls 143 that are substantially perpendicular to the surface 141 of the substrate 110. Examples of appropriate anisotropic etch techniques were discussed above. In the embodiment illustrated in FIGS. 5 and 6, the anisotropic etch will form an opening 150 only through the dielectric layer 112 or a portion thereof. Returning to FIG. 7, following the anisotropic etch to create opening 150, the mask 140 is removed from the surface 141 of the substrate 110.

Figure 8:
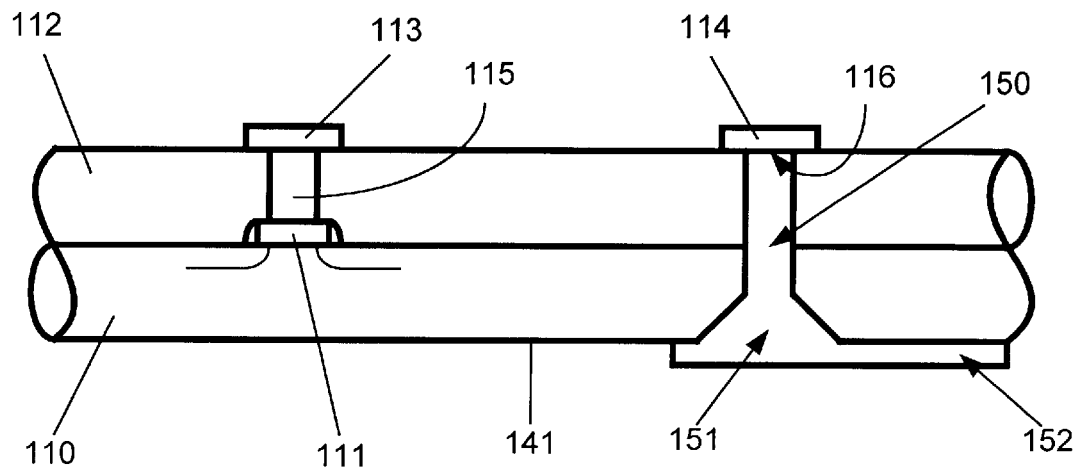

Referring to FIG. 8, a conductive material 151 may be used to fill the opening 150 and form the contact 152 in a manner similar to the formation of contact 146 as illustrated and described in connection with FIG. 3 above. As described above, a thin insulating film may be formed on the sidewalls of the opening 150 and on the surface 141 of the substrate 110. Because the material 151 used to fill the opening 150 and to form the contact 152 need not be of the same type as the conductive material used to form the interconnect 114, a cladding layer may be required between the two materials. A refractory metal or refractory metal nitride may be used to coat the undersurface 116 of the interconnect 114. The refractory metal or refractory metal nitride may then interface between the conductive material of interconnect 114 and the conductive material 151 of the contact 152.

An alternative method for filling the opening 150 as well as the opening 148A of FIG. 7 (and the openings 148B and 148C of FIGS. 5 and 6, respectively) comprises an electroplating method wherein the interconnect 114 (or other appropriate structure on or atop the substrate 110) is coupled to an anode source while a bath is coupled to. a cathode source. The bath may include, by way of example, copper sulfate and sulphuric acid.

After removal of the mask 140 from the backside of the substrate 110, and after the formation of an insulating layer (if any) on the sidewalls 143 of the opening 150 and on the surface 141 of the substrate 110, the surface 141 of the substrate 110 may be immersed into the bath with the aforementioned anode and cathode connections in place. The conductive material from the bath will plate the underside of the interconnect 114 and fill the opening 150. The plating action will continue, to fill the opening 148A (or 148B or 148C, as the case may be) as well as to form a conductive layer over the surface 141 of the substrate 110. Thereafter, as before, the conductive material may be patterned and etched, using well-known techniques, to form the contact 152.

In preparation for forming the contact of the present invention, the substrate wafer may be thinned using any of a variety of well known techniques. By thinning the substrate, the etch steps to form the contact opening through the substrate may be accomplished more quickly. In general, the backside contact may be formed before or after full top-end processing of the wafer or integrated circuit. Using the backside contact and methods of this invention, the cross-section of the contact can be enlarged as compared to prior contacts. Further, the length of the contact from the surface of the substrate to the interconnect of interest will generally be shorter as compared to prior contacts. Consequently, the contact will present a lower resistance to the flow of electric current, generating less heat that must be dissipated. Finally, packaging of an integrated circuit employing the backside contact of this invention may be accomplished in a manner similar to the packaging of multi-die arrangements.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for forming a contact, comprising:
    forming a dielectric layer over a first surface of a semiconductor substrate;
    forming a conductive interconnect over the dielectric layer;
    forming a mask over a second surface of the semiconductor substrate, the mask including a mask opening therein;
    anisotropically etching the substrate and the dielectric layer through the mask opening to expose at least a portion of the conductive interconnect, wherein anisotropically etching the substrate and the dielectric layer forms an opening having sidewalls extending between approximately the second surface of the substrate and approximately the conductive interconnect, the sidewalls being substantially perpendicular to the second surface of the substrate; and
    filling the opening with a conductive material to provide electrical contact with the conductive interconnect.

2. The method of claim 1, further comprising isotropically etching the substrate through the mask opening before anisotropically etching the substrate and the dielectric layer.

3. The method of claim 1, further comprising forming a cladding interface between the conductive interconnect and the conductive material.

4. The method of claim 1, further comprising thinning the substrate before forming an opening in the substrate and in the dielectric layer to expose at least a portion of the conductive interconnect.

5. The method of claim 1, further comprising forming an insulating layer on sidewalls of the opening before filling the opening with a conductive material.

6. A method for forming a contact, comprising:
    forming a dielectric layer over a first surface of a semiconductor substrate;
    forming a conductive interconnect over the dielectric layer;
    forming a mask over a second surface of the semiconductor substrate, the mask including a mask opening therein;
    isotropically etching the substrate through the mask opening; and
    anisotropically etching the dielectric layer through the mask opening.

7. The method of claim 6, further comprising isotropically etching the dielectric layer before anisotropically etching the dielectric layer.

8. The method of claim 7, further comprising filling the opening with a conductive material to provide electrical contact with the conductive interconnect.

* * * * *